(12) United States Patent
Cohn et al.

(10) Patent No.: US 6,651,230 B2
(45) Date of Patent: Nov. 18, 2003

(54) METHOD FOR REDUCING DESIGN EFFECT OF WEAROUT MECHANISMS ON SIGNAL SKEW IN INTEGRATED CIRCUIT DESIGN

(75) Inventors: John Maxwell Cohn, Richmond, VT (US); Jose Luis Pontes Correia Neves, Wappinger Falls, NY (US); Paul Steven Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 09/683,276

(22) Filed: Dec. 7, 2001

(65) Prior Publication Data

US 2003/0110462 A1 Jun. 12, 2003

(51) Int. Cl.$^7$ .............................................. G06F 17/50
(52) U.S. Cl. ................................... 716/6; 716/4; 716/5
(58) Field of Search ......................................... 716/4–6

(56) References Cited

U.S. PATENT DOCUMENTS

| | | | |
|---|---|---|---|
| 4,833,695 A | | 5/1989 | Greub |
| 5,163,068 A | | 11/1992 | El-Amawy |
| 5,329,188 A | | 7/1994 | Sikkink et al. |
| 5,377,205 A | | 12/1994 | Shi |
| 5,467,464 A | | 11/1995 | Oprescu et al. |
| 5,638,019 A | | 6/1997 | Frankeny |
| 5,656,963 A | * | 8/1997 | Masleid et al. ............. 327/297 |
| 5,828,250 A | | 10/1998 | Konno |
| 5,896,299 A | * | 4/1999 | Ginetti et al. ................ 364/490 |
| 6,024,478 A | * | 2/2000 | Yamamoto .................. 364/488 |

OTHER PUBLICATIONS

Moon et al., "Estimation and Removal of Clock Skew from Network Delay Measurements," IEEE, Mar. 1999, pp. 227–234.*

Walton et al., "Data Skew and the Scalability of Parallel Joins," IEEE, 1991, pp. 44–51.*

Rosa et al., "NBTI–Channel Hot Carrier Effects in PMSOFETS in Advanced CMOS Technologies," IEEE, 1997, PP. 282–286.*

Chaparala et al., "Threshold Voltage Drift in PMOSFETS Due to NBTI and HCI," IEEE, Oct. 2000, pp. 95–97.*

(List continued on next page.)

Primary Examiner—Vuthe Siek
(74) Attorney, Agent, or Firm—Richard A. Henkler; Bracewell & Patterson, L.L.P.

(57) ABSTRACT

A method for reducing the effect of signal skew degradation in the design of an integrated circuit is provided. First, a circuit design library is created describing library cells as a function of one or more environmental variable, wherein the one or more environmental variable includes a skew degradation variable indicating skew degradation of a signal as a function of a total number of signal switches of the signal. Then, the integrated circuit design is modeled utilizing the circuit design library to determine a first skew degradation for each of the first and second signals at a first predetermined number of signal switches, and a second skew degradation for each of the first and second signals for a second predetermined number of signal switches, and further to determine a first relative skew degradation for a first predetermined number of signal switches and a second relative skew degradation for a second predetermined number of signal switches, wherein a relative skew degradation is equal to the difference of the skew degradation of the first signal and the skew degradation of the second signal for a given number of signal switches. Next, a skew shift equal to the difference between the first relative skew degradation and the second relative skew degradation is calculated. Finally, the integrated circuit design is modified such that a skew degradation of the first signal at the first predetermined number of signal switches is determined to be equal to the first skew degradation of the first signal minus half of the skew shift.

21 Claims, 4 Drawing Sheets

OTHER PUBLICATIONS

Kawakami et al., "Gate–Level Aged Timing Simulation Methodology for Hot–Carrier Reliability Assurance," IEEE, Jan. 2000, pp. 289–294.*

BObba et al., "Simultaneous Switching Noise in CMOS VLSI Circuits," IEEE, Apr. 1999, pp. 15–20.*

Vittal et al., "Clock Skew Optimiization for Ground Bounce Control," IEEE, 1996, pp. 395–399.*

* cited by examiner

METHOD FOR REDUCING DESIGN EFFECT OF WEAROUT MECHANISMS ON SIGNAL SKEW IN INTEGRATED CIRCUIT DESIGN

BACKGROUND OF THE INVENTION

1. Technical Field

The present invention relates in general to the field of integrated circuits and, in particular, to circuit design methodology and tools. More particularly, the present invention relates to a method for reducing the effect of wearout mechanisms on signal skew in the design of an integrated circuit.

2. Description of the Related Art

Electronic devices, such as application-specific integrated circuits (ASICs), processors, memory components, controllers, signal converters, and other integrated circuits (ICs) are commonly found in electronic systems such as desktop, mobile, and hand-held computers. These electronic devices contain storage circuits, such as latches, flip-flops, and registers, that are connected to each other by signal lines that enable one storage circuit to communicate with another. Signal lines carry different types of signals such as data and clock signals. A logic signal line carries data signals, including, for example, address, data, or control information, and a clock signal line carries clock signals. A clock signal is a signal that controls the operation of a circuit by synchronizing the time intervals during which data signals can be communicated from one storage circuit to another.

It is important that a data signal from a first storage circuit to a second, sequential storage circuit, traveling along a data signal line, is delayed long enough to ensure that the data signal does not reach the second storage circuit before the clock signal to the second storage circuit properly gates the data signal at the input to the second storage circuit. Otherwise, data may be lost. Delay on the data signal line is increased by, for example, inverters, logic gates, or other buffers on the data signal line that impede the path of the data signal communicated along the data signal line.

It is important that the design of elements placed on the data signal line cause a delay on the data signal that is more than the minimum amount of time that is necessary to preserve data integrity and less then the maximum time prior to a setup violation. In addition, the speed of communication between the two sequential storage circuits should not be unduly slowed by over-compensating for setup and hold, potentially slowing the speed of the electronic device. It is the job of the circuit designer to verify proper communication between two sequential storage circuits by ensuring that the data signal on the data signal line between the two storage circuits is designed with adequate setup and hold times. However, this verification is typically done during circuit simulations, before the electronic device is actually manufactured. Unfortunately, because this verification is done during simulation, the exact amount of delay that is necessary to ensure proper communication between two circuits cannot be known, and is therefore estimated based on the layout of the circuit, the frequency of the clock, the manufacturing process, and other factors. Because of these margins for error in the simulation, designers will often design in a margin, or "guard-band," to the timing parameter of the design.

Within an integrated circuit, the clock signal, also known as a "global" clock signal, is used to synchronize data operations performed by elements positioned at different locations on the chip. For example, an element at one location may indicate that information will be available in an internal register during the next global clock cycle. By using the same global clock signal, an element at another location may read the information from the register at the appropriate time. With each new process generation, the frequency of the global clock signal has also increased.

The performance of an IC is based, at least in part, on the synchronization of the global clock signal throughout the chip. Clock skew, the difference in arrival time of the clock signal to various clocked elements, limits the performance of the design. For example, it is desirable that information stored in a register is not read before the information has been correctly updated. Moreover, waiting too long before reading the information will usually slow down the operation of the IC. Thus, it is desirable to have the global clock signal arrive at different locations, or destinations, as close to simultaneously as possible.

A number of factors may cause the global clock signal to be skewed at different locations on the chip. For example, variations in the effective channel length of devices across the chip may occur because of in-die variations resulting from lens distortion, wafer planarity or stepper accuracy. Local effects, like device proximity, may also result in variations in channel length. Supply voltage variations across the chip may likewise cause skew, depending on the power grid design and proximity to high activity or large devices. Moreover, Inter-Layer Dielectric (ILD) thickness variation, causing variations in interconnect capacitance, and signal coupling to neighboring lines, may result in delay variation. Also, a un-modeled effects or deficiencies in the modeling may also contribute to skew.

As will also be appreciated by those skilled in the art, the detrimental effect of clock skew may force the designer to similarly reduce the effective clock period for setup times in certain logic paths within the design, and thus may reduce the performance of the design. For high performance designs that have strict timing requirements, clock skew may consume a substantial portion of the total clock period available for signal setup and this must also be carefully controlled by the designer.

Therefore, one goal of clock tree design is to minimize clock skew. Clock skew is present because of both design skew and process skew. Design skew results from a clock tree design that is not optimal. Different portions of the clock tree may have different loads, or signal routes may not be exactly the same length. Process skew results from the manufacturing process used to make the die. Across-chip variation in line-widths and implant doses can cause otherwise identical circuits to act differently depending on their position on a chip. The total clock skew of the design is the sum of these two components. Clock skew is managed as part of the chip design, and a clock skew budget is usually created. Once the design skew is known and the process skew is estimated, the clock skew of the design can be compared to the clock skew budget. Alternatively, the clock tree can be designed with minimum clock skew and the performance of the chip is then "set" given the actual clock skew achieved. If the actual skew of the design is worse than the skew that was assumed during the design of the chip, the design may not function. Likewise, if the actual skew is less than the skew that was assumed during the design of the chip, the design will not be operating up to its full potential.

One factor further complicating this design problem is the current trend in semiconductor design to allow clock gating (make inactive during periods of non-use) of clock trees and other circuits as means of reducing power requirements. As the number of circuits that can be placed on a die increases, and the frequency of operation increases, the power requirements of the die increases. In order to prolong battery life or in order to be able to use simpler packaging solutions, semiconductor designers must find ways of lowering on-chip power. One method of doing this is gated clock trees. When a clock tree is gated, it does not propagate the clock signal and therefore clocked devices do not switch, saving active power.

With the use of clock gating, different frequencies of use of data paths, different numbers of delay elements introduced along data paths between registers, use of different circuits to perform similar functions, input skews, and different loading on the same circuit, all can contribute an additional component of skew due to the variable effects of device wearout mechanisms on each of the different circuits across the chip. In particular, every circuit on a chip is subject to wearout mechanisms, two of which are NBTI (negative bias threshold instability) and hot electrons. These mechanisms cause changes to occur in individual transistors. These changes are a function of how the transistor is used as a function of time. When a circuit is gated, as in clock tree gating, the circuit undergoes different "aging" than a circuit that is not gated. This difference in aging, in the context of gated clock trees, can result in additional clock skew. This additional skew, due to difference in use between two otherwise identical circuits, causes the performance of the design to be lower than would be obtained had the gating not been present. Alternatively, if the skew due to gating is not accounted for when the initial design was completed, the chip could fail to function at some point later in time due to the additional skew caused by the clock gating.

Several methods of reducing global clock skew are well-known. For example, designers strive to reduce the part of the path that is different between two clock signals. Because each portion, or "stage," which is different may contribute to the clock skew, reducing the number of stages which are different may reduce the clock inaccuracy. Clocks which are logically the same may also be tied together when they are physically close, and a common node is no more than two or three stages back. Additionally, attempts have been made to reduce signal coupling to clock lines, but this generally involves increased line spacing or the insertion of shielding wires. All of these solutions have become less effective with the increase in IC clock frequency. Moreover, the methods have become more difficult because the number of elements in a single IC has increased dramatically over the years. Most importantly, these prior art methods do not take into account the degradation of signal skew due to wearout mechanisms.

In view of the foregoing, a need exists for a method for reducing the effects of skew degradation over the lifetime of a part to improve synchronization within an integrated circuit, and solving the other problems discussed above.

BRIEF SUMMARY OF THE INVENTION

To address the above and other shortcomings in the art, the present invention provides a method for designing an integrated circuit containing a clock tree or memory, that accounts for the asymmetric shift in performance between different circuits over the lifetime of the integrated circuit due to wearout mechanisms, such as NBTI and hot-e effects. An improvement of half of the portion of skew due to wearout mechanisms can be obtained.

Therefore, in accordance with the present invention, a method for reducing the effect of signal skew degradation in the design of an integrated circuit is provided. First, a circuit design library is created describing library cells as a function of one or more environmental variable, wherein the one or more environmental variable includes a skew degradation variable indicating skew degradation of a signal as a function of a total number of signal switches of the signal. Then, the integrated circuit design is modeled utilizing the circuit design library to determine a first skew degradation for each of the first and second signals at a first predetermined number of signal switches, and a second skew degradation for each of the first and second signals for a second predetermined number of signal switches, and further to determine a first relative skew degradation for a first predetermined number of signal switches and a second relative skew degradation for a second predetermined number of signal switches, wherein a relative skew degradation is equal to the difference of the skew degradation of the first signal and the skew degradation of the second signal for a given number of signal switches. Next, a skew shift equal to the difference between the first relative skew degradation and the second relative skew degradation is calculated. Finally, the integrated circuit design is modified such that a skew degradation of the first signal at the first predetermined number of signal switches is determined to be equal to the first skew degradation of the first signal minus half of the skew shift.

All objects, features, and advantages of the present invention will become apparent in the following detailed written description.

BRIEF DESCRIPTION OF THE SEVERAL VIEWS OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Detailed Description of Illustrative Embodiment

Figure 1:
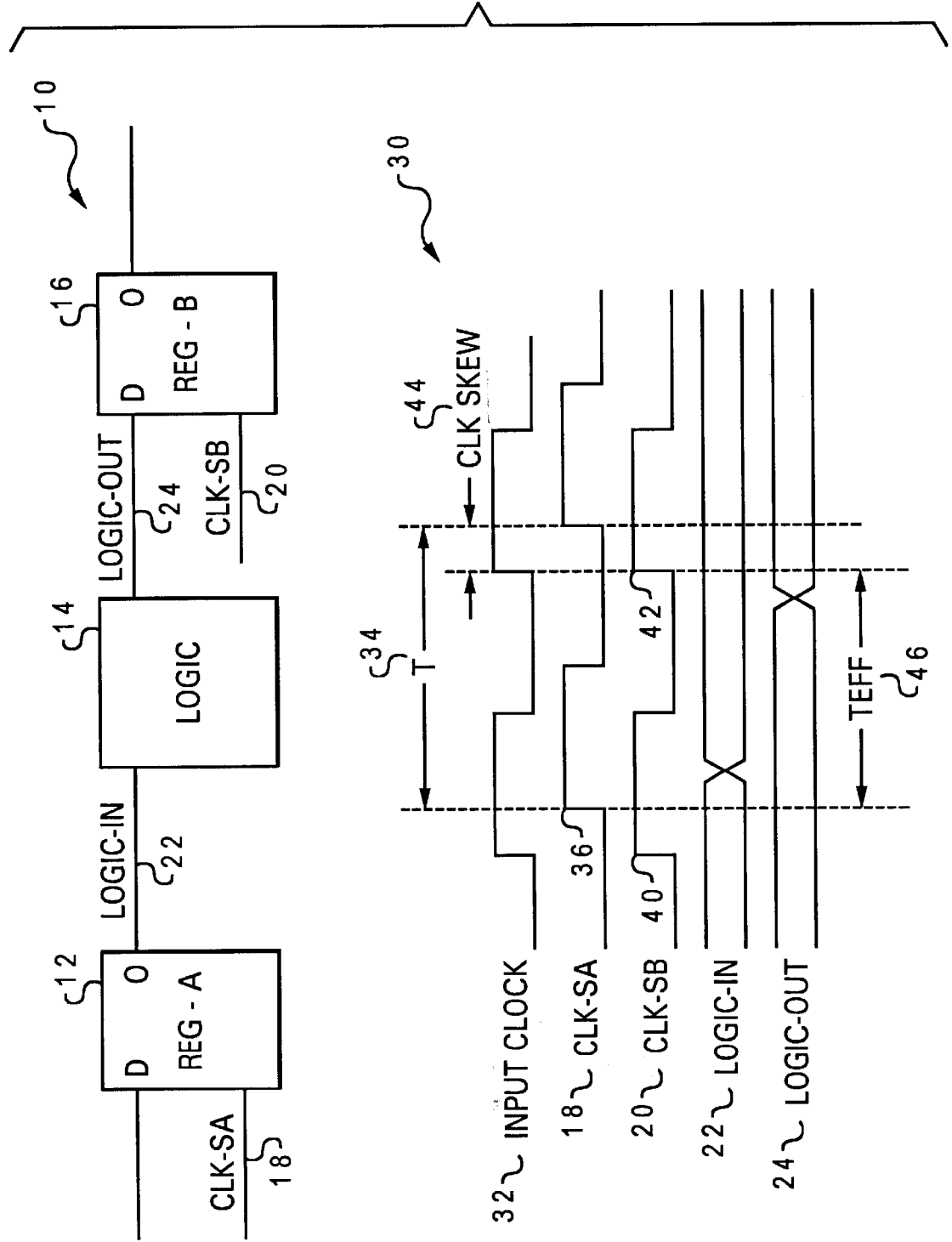
FIG. 1 is a circuit having functional unit blocks and clock signal lines, and a timing diagram therefor, in accordance with an embodiment of the present invention.

With reference now to the figures, wherein like parts are designated by like reference numerals throughout, and in particular with reference to FIG. 1, there is shown a diagram illustrating a reduction in the effective clock period between registers caused by clock skew. An illustrative timing path is shown in the circuit 10, and a timing diagram therefor is shown at 30. The circuit 10 includes a first rising edge triggered register 12, a second rising edge triggered register 16, and a logic block 14 there between. The first register 12 is clocked by a first clock signal 18 and the second register 16 is clocked by a second clock signal 20.

With reference to the timing diagram 30, an input clock is shown at 32. The input clock 32 is assumed to be the clock that is provided to an integrated circuit. The first clock signal 18 and the second clock signal 20 are generated from the input clock signal 32 via a clock tree or the like. The timing diagram 30 shows that the first clock signal 18 is skewed relative to the second clock signal 20, as shown at 44. This clock skew may be caused by, among other factors, a differential in hot carrier degradation in the clock tree delays between signals 18, 20 produced by clock gating or other differences in switching of the signals over the operational life of the part.

On the rising edge 36 of the first clock signal 18, the first register 12 may release data to the logic block 14 via the logic-in signal 22. The data flows through the logic block 14 and arrives at the data input of the second register 16 via the logic-out signal 24. The data must arrive at the second register 16 before the rising edge 42 of the second clock signal 20 for the data to be latched into the second register 16.

The CLK-SA signal 18 has a clock period "T" as shown at 34. However, because of the clock skew 44 between the first and second clock signals, the effective clock period "Teff" 46 between the rising edge 36 of the first clock signal 18 and the subsequent rising edge 42 of the second clock signal 20 is less than the clock period "T" 34. This effectively reduces the time allowed for the data to pass through the logic block 14, and thus may reduce the performance of the logic path.

For the above reasons, a primary goal of a clock tree is to minimize clock skew between clocked elements. As shown above, clock skew may reduce the effective clock period for certain logic paths within the design, and thus may reduce the performance of the design. For high performance designs that have strict timing requirements, clock skew may consume a substantial portion of the total clock period. Clock skew may have a number of other detrimental effects on the performance of a circuit design, only some of which are described below. For example, clock skew may cause hold time violations when only a small amount of logic is provided between registers. Further, clock skew may cause communication problems between integrated circuits. It should be recognized that these are only illustrative examples of effects that clock skew may have on a system.

In modern circuit design, where electronic design automation and software tools are used to design and simulate a chip before it is manufactured, the precise local or global skew corresponding to a particular pair of sequential circuits is unknown. Therefore, to ensure proper communication between the sequential circuits under all potential conditions (within the bounds of manufacturing (or process) variation and device operation variation, such as temperature and voltage, and wearout mechanisms, such as hot-e effects and NBTI), the data signal line that connects the first circuit to the second circuit is designed to accommodate the worst case local clock signal skew. The worst case skew is determined by accounting for all components that make up the total clock skew, including skew resulting from process variation, device operation variation, such as temperature and voltage, and wearout mechanisms, such as hot-e effects and NBTI. Therefore, designers make every effort to minimize the guard-band required to account for all these components that make up clock skew in the design of the clock tree.

Figure 2:
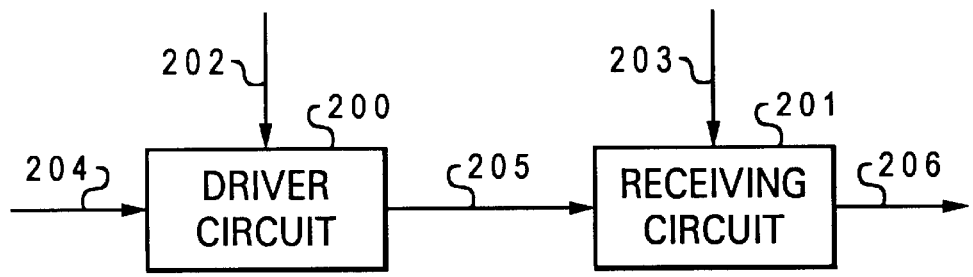
FIG. 2 is two circuits configured to communicate with each other for one embodiment of the present invention.

FIG. 2 is two circuits, 200 and 201 configured to be in communication with each other via data signal 205 which is output from the first driving circuit 200 and input to the second, sequential, receiving circuit 201 via one or more data signal lines that connect the two circuits to each other. Circuit 200 receives signal 204 at its input, and is timed by clock signal 202. Circuit 201 is timed by clock signal 203, and produces signal 206 at its output. In accordance with one embodiment of the present invention, circuits 200 and 201 are latches, the inputs to which are gated by pass gates controlled by clock signals 202 and 203, respectively. For an alternate embodiment, the present invention is implemented to design any other type of circuit or circuits that are timed by a clock or data signal subject to the skew degradation effects of wearout mechanisms such as, for example, RAM data ports, a gated NAND gate, a gated NOR gate, another logic gate, a multiplexer, demultiplexer, comparator, inverter, some other buffer, adder, transistor, pass gate, or any other timed or synchronous circuit. In another alternative preferred embodiment, circuit 200 is a driver circuit within a clock tree (such as the one in FIG. 3), and data signal 205 is a clock signal generated from the clock tree to clock, or time, circuit 201.

Figure 3:
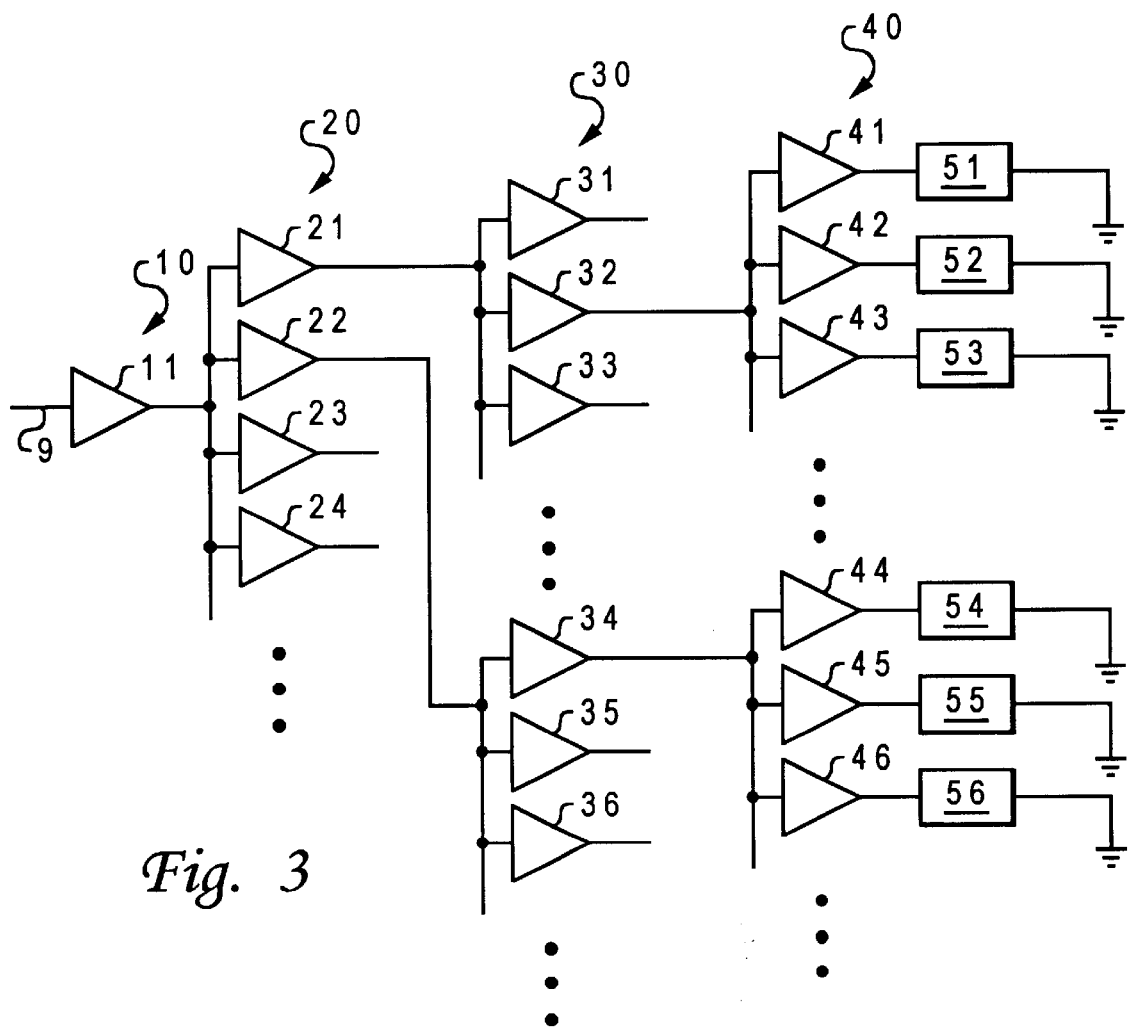
FIG. 3 is a schematic block diagram of a clock tree that can be designed using the method of a preferred embodiment of the present invention, according to a preferred embodiment of the present invention.

Referring now to FIG. 3, there is shown a schematic block diagram of a clock tree that can be designed using the method of a preferred embodiment of the present invention. An input clock signal is delivered over line 9 to a first stage (10) driver 11. The output of driver 11 is delivered to a plurality of second stage (20) drivers. While four are shown (21–24), it should be recognized that this number can be larger or smaller depending on known fanout or load determining factors such as impedance and conductor length, etc, and the number of destinations to be fed, amongst other considerations. The outputs of the second stage drivers are in turn coupled to the input of third stage (30) drivers 31–36, and the third stage drivers are similarly coupled to fourth stage (40) drivers 41–46. In the illustrated embodiment, clock signals output from the fourth stage are delivered to their destinations (functional logic) which are represented as loads 51–56. It should be recognized that the number of stages and the number of drivers within each stage is dependent upon the number of locations to which the clock signals need be delivered and the fanout ability of each driver, etc., as is generally known. Each stage within clock tree 10 induces a certain amount of delay in a clock signal propagating there through due to factors such as parasitic capacitance and inductance, load considerations and the inherent properties of semiconductor material, etc. Also, the amount of delay induced by one driver may be different from that induced by another resulting in clock skew.

Figure 4:
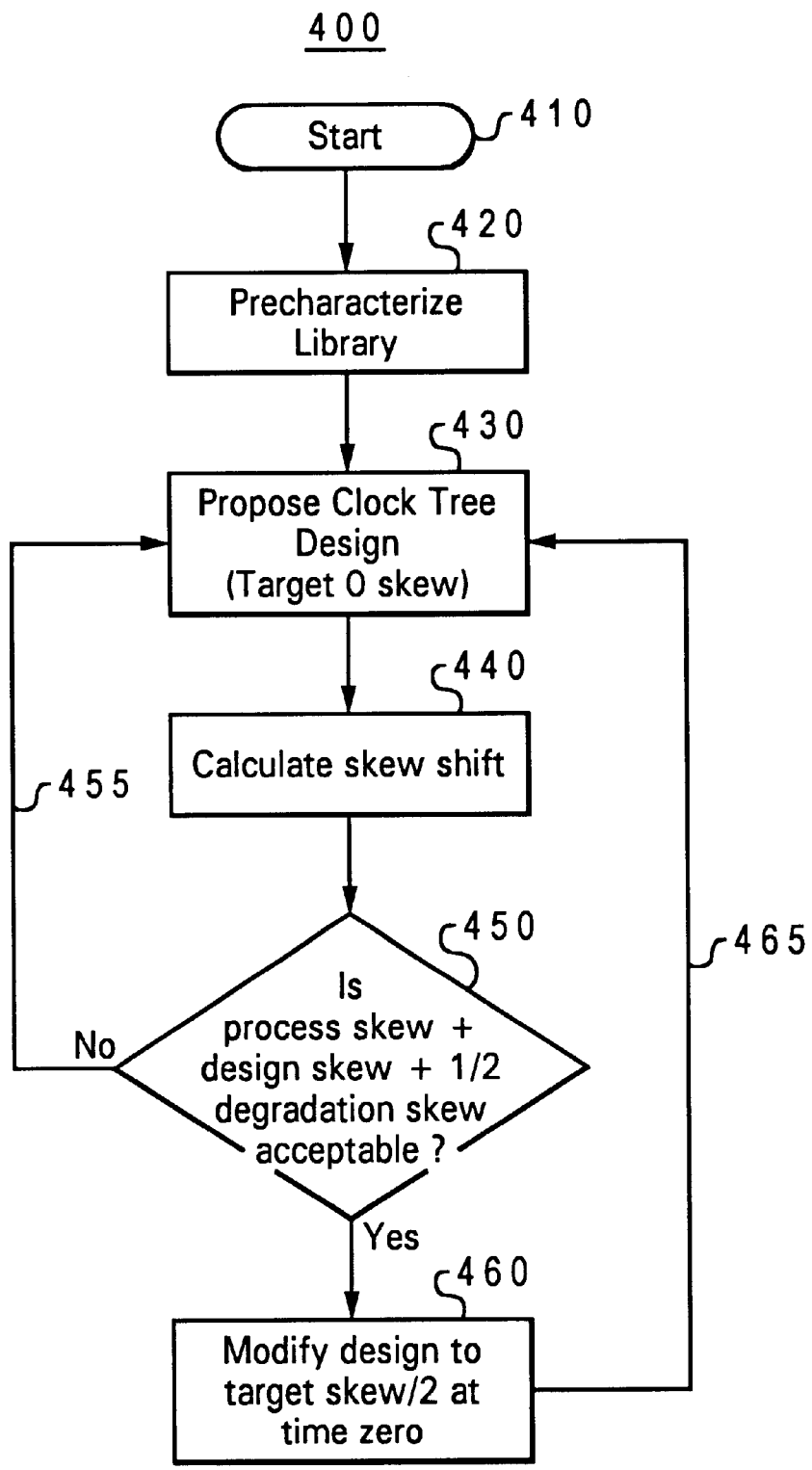
FIG. 4 is a flow diagram of the method for reducing the effect of clock skew degradation in the design of an integrated circuit, in accordance with a preferred embodiment of the present invention.

Referring now to FIG. 4, there is shown a flow diagram of the method for reducing the effect of clock skew degradation in the design of an integrated circuit, in accordance with a preferred embodiment of the present invention. As will be appreciated, the method of the present invention is implemented in a program product (software tool) for use by a circuit designer in a computer (for example, a computer-aided-design) system, in a preferred embodiment. The process 400 starts at step 410, and proceeds with step 420 of pre-characterizing an ASIC cell library to include the characterization of wearout mechanisms', such as hot-e (hot-carrier) and NBTI, effects on timing. The characterization data of the cell library is made to be a function of environmental variables such as input transition rate, output load, temperature, voltage, and the number of times a transistor switches. This characterization data describes the delay in clock signals (or data signals) as a function of each of the library variables. The degradation or change in skew over a number of transistor switches is called skew degradation. The characterization data for degradation will indicate the shift in a clock signal due to skew degradation as a function of the number of times the circuit switches. For a given application, depending on operation and environment, for example, such as clock gating, it will be appreciated that a circuit designer can translate the expected lifetime of a part into a number of circuit switches. As will also be appreciated, the characterization data is stored in an abstracted model of the library cell in the same way as other timing information is normally abstracted and stored in a cell library. As will be further appreciated, the characterization data can be set up as a table look-up or a set of equations that may be accessed by the design tool modeling a circuit design.

The process then proceeds to step 430, where the circuit designer designs and simulates a proposed integrated circuit design. In a preferred embodiment of the present invention, the proposed integrated circuit design is a clock tree designed for a particular chip. The software tools used to design integrated circuits such as a clock tree, implement the design to have zero amount of skew between different circuit blocks receiving the same signals, such as clock signals or data. In the design of a clock tree, a zero skew is targeted between different leaf cells within a clock domain.

The process 400 then proceeds to step 440 where a skew shift is calculated. The designer inputs specific data about the environmental factors that will affect the operation of the part over its lifetime, such as operational temperature, voltage, switching factor, expected lifetime. The design tool of the preferred embodiment combines this environmental information with the abstracted degradation model in the cell library created in step 420 to produce an accurate model of the chip describing skew degradation over the lifetime of the part. As the specific application environmental data is applied to the degradation model of the circuit, the simulation creates a degradation model of the chip showing how identical or similar circuits within the part degrade differently over time. For example, if the proposed clock tree design includes two identical clock buffer designs, but one clock buffer will be clock gated more often than the other clock buffer, the first buffer will have less skew degradation than the second. Continuing at step 440, the software tool will calculate the skew degradation for every circuit in the chip. This analysis occurs at each clock cell instance in the design and is used to calculate the "end-of-life" delay model for each instance.

The relative skew degradation for a particular instance that occurs at the "end of life" can then be calculated by subtracting the initial skew degradation of that instance at the "beginning-of-life" for the part (i.e. time=0) from the end-of-life skew degradation calculated. In process 400 of the preferred embodiment, the initial skew degradation at time=0 was assumed to be zero as seen in step 430. It will be appreciated from the description of process 400 below that the method of the preferred embodiment results in a minimization of the effects of skew degradation at the "mid-life" or half way through the operational life of a part. However, if the designer desired to minimize skew degradation at a different point in the life of the part, an initial skew degradation would be designed into the part at step 430.

Continuing with step 430, a skew shift between similar circuits on the chip is calculated. The skew shift is equal to the relative skew degradation of one clock signal with respect to the relative skew degradation of a second clock signal. The skew shift provides a measure of the difference in effect that wearout mechanisms have on identical circuit elements on the chip subjected to different environmental factors over the lifetime of the part. This analysis continues until a skew shift is calculated for all clock signals. Note that some clock signals may have zero (or assumed zero) skew shift.

The process then proceeds to step 450 where a determination is made whether the overall skew of a particular clock signal is acceptable. Half of the skew shift calculated in step 440 is added to the process skew plus the design skew to obtain an overall skew. It is then determined at step 450 whether this overall skew is manageable for the design. If not, the process returns to step 430 along path 455, where the chip is modified; otherwise the process proceeds to step 460.

At step 460, the design is modified such that each clock signal having a positive skew shift is time-shifted in the negative direction (relative to the skew degradation at time= 0) at a magnitude equal to half the skew shift calculated in step 440. The design is modified such as by increasing the size of the clock driver or changing the length of the signal path (wiring). In summary, as between two clock signals, the method of the preferred embodiment is to design the skew degradation of the clock signal having the higher level of skew degradation over the lifetime of the part to have an initial skew degradation set to half of the skew shift calculated in step 440 in the negative phase direction. Thereafter step 460, the process returns to step 430 along path 465, where, based on the analysis of steps 440, 450, 460, the design is tuned to off-set the skew degradation designed for each clock signal at time=0. The design is then passed through the process loop again to analyze the final results for skew degradation of the re-tuned design. The process can be repeated through path 465 as many times as needed to achieve the final desired results.

Figure 5:
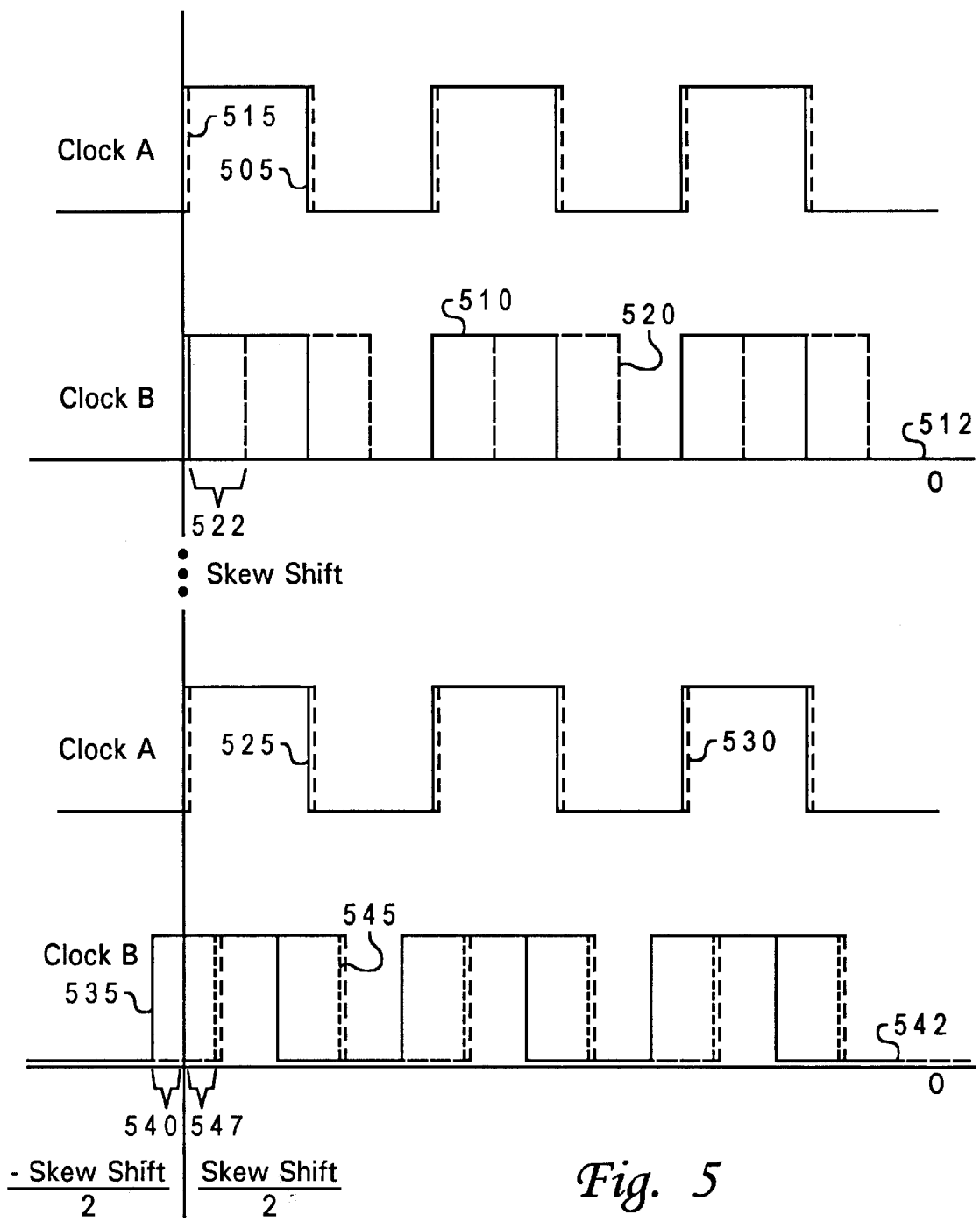
FIG. 5 is a timing diagram exemplifying the method for designing clock signals in an integrated circuit, in accordance with the preferred embodiment of the present invention.

Referring now to FIG. 5, there is shown a timing diagram exemplifying the method for designing clock signals in an integrated circuit, in accordance with the preferred embodiment of the present invention. FIG. 5 graphically shows how an integrated circuit is designed to minimize the effect of skew degradation for two clock drivers, clock A and clock B, over the life of the part. During the design of the integrated circuit at step 430, clock A is designed to have clock signal 505, and clock B is designed to have clock signal 510. Clock signals 505 and 510 are initially designed and simulated to have zero skew relative to each other. This can be seen in FIG. 5, where clock signals 505 and 510 are aligned along the x-axis 512, wherein the x-axis 512 represents time and the time-shift, or phase, of the signals is the difference of the signals along the x-axis 512.

Clock signal 515 shows the skew degradation of clock A, and clock signal 520 shows the skew degradation of clock B, as calculated at the end-of-life for the part at step 440. For illustrative purposes, clock A is shown to have no skew degradation over the life of the part. Clock B is shown to have skew degradation equal to the time-shift (phase shift) 522. Because clock A has zero skew degradation, the skew degradation of clock B is equal to the relative skew shift between clock A and clock B, as calculated in step 440. If half of the skew shift 522 is manageable within the design constraints of the integrated circuit as determined at step 450, the process proceeds to step 460, where the integrated circuit design is modified such that the clock driver circuit or signal path produces a phase shift of clock B (at time=0 in the life of the part) equal to half of the skew shift 522 in the negative phase direction along x-axis 512.

FIG. 5 shows the clock signals 525, 530, 535, 545 produced by clocks A and B after being modified at step 460. As shown in FIG. 5, clock signal 525 shows the skew degradation of clock A at time=0, and clock signal 530 shows the skew degradation of clock A at the end-of-life of the part. As can be seen, clock A has been modeled to show zero skew degradation over the life of the part. However, in accordance with a preferred embodiment of the present invention, the design of clock B has been modified at step 460 to produce a clock signal 535 at time=0 having a skew degradation 540. Skew degradation 540 has a phase shift having a magnitude of half of the skew shift 522, but in the negative phase direction along x-axis 542. Clock signal 545 shows the skew shift of clock B at the end-of-life of the part. As will now be appreciated, the skew shift between clock signal 545 and clock signal 530 is equal to skew shift 547, which is half of the skew shift 522 produced by the circuit design prior to modification of the integrated circuit design, in accordance with a preferred embodiment of the present invention.

As will now be appreciated, the method of the preferred embodiment of the present invention has reduced by half the amount of guard-band the circuit designer must include in his circuit design to account for skew degradation caused by wearout mechanisms over the lifetime of a part. Thus, the present invention provides an design advantage allowing the circuit designer to more accurately design the circuit to enhance performance or reduce cost, while ensuring reliable operation of the life of the part. While the invention has been particularly shown and described with reference to a preferred embodiment, it will be understood by those skilled in the art that various changes in form and detail may be made therein without departing from the spirit and scope of the invention.

What is claimed is:

1. A method for reducing an effect of signal skew degradation in the design of an integrated circuit, having a first circuit generating a first signal and a second circuit generating a second signal, the method comprising:
    determining a first skew degradation and a second skew degradation for each or the first and second signals for a second predetermined number of signal switches;
    calculating a skew shift equal to the difference between a first relative skew degradation and a second relative skew degradation; and
    modifying the integrated circuit design such that a skew degradation of the first signal at a first predetermined number of signal switches is determined to be equal to the first skew degradation of the first signal minus a portion of the skew shift.

2. A method according to claim 1, wherein the first and second signals are clock signals.

3. A method according to claim 1, wherein the first circuit is a clock tree.

4. A method according to claim 1, wherein the first circuit is a RAM data port.

5. A method according to claim 4, wherein the first signal is a data signal.

6. A method according to claim 1, wherein the first relative skew degradation and the first predetermined number of signal switches are equal to zero.

7. A method according to claim 1, further comprising the steps of determining if the skew shift is an acceptable degradation skew for the integrated circuit design, and, if not, modifying the integrated circuit design to generate a new first skew degradation for the first and second signals at the first predetermined number of signal switches.

8. A method according to claim 1, further comprising the step of creating a circuit design library describing library cells as a function of one or more environmental variable, wherein the one or more environmental variable includes a skew degradation variable indicating skew degradation of a signal as a function of a total number of signal switches of the signal.

9. A method according to claim 8, wherein the one or more environmental variable includes design skew and process skew and wherein the step of modifying the integrated circuit design such that a skew degradation of the first signal at the first predetermined number of signal switches is determined to be equal to the first skew degradation of the first signal minus half of the skew shift plus design skew and process skew.

10. A method according to claim 8, wherein the skew degradation variable is determined as a function of wearout mechanisms.

11. A program product for reducing an effect of signal skew degradation in the design of an integrated circuit, having a first circuit generating a first signal and a second circuit generating a second signal comprising:
    a computer-readable medium;
    a computer program encoded in the computer-readable medium, the program comprising the steps of:
        determining a first skew degradation for each of the first and second signals at a first predetermined number of signal switches;
        determining a second skew degradation for each of the first and second signals for a second predetermined number of signal switches;
        calculating a skew shift equal to the difference between a first relative skew degradation and a second relative skew degradation; and
        modifying the integrated circuit design such that a skew degradation of the first signal at the first predetermined number of signal switches is determined to be equal to the first skew degradation of the first signal minus a portion of the skew shift.

12. A program product according to claim 10, wherein the first and second signals are clock signals.

13. A program product according to claim 10, wherein the first circuit is a clock tree.

14. A program product according to claim 10, wherein the first circuit is a RAM data port.

15. A program product according to claim 13, wherein the first signal is a data signal.

16. A program product according to claim 10, wherein the first relative skew degradation and the first predetermined number of signal switches are equal to zero.

17. A program product according to claim 10, further comprising the steps of determining if the skew shift is an acceptable degradation skew for the integrated circuit design, and, if not, modifying the integrated circuit design to generate a new first skew degradation for the first and second signals at the first predetermined number of signal switches.

18. A program product according to claim 10, further comprising the step of creating a circuit design library describing library cells as a function of one or more environmental variable, wherein the one or more environmental variable includes a skew degradation variable indicating skew degradation of a signal as a function of a total number of signal switches of the signal.

19. A program product according to claim 17, wherein the one or more environmental variable includes design skew and process skew and wherein the step of modifying the integrated circuit design such that a skew degradation of the first signal at the first predetermined number of signal switches is determined to be equal to the first skew degradation of the first signal minus half of the skew shift plus design skew and process skew.

20. A program product according to claim 17, wherein the skew degradation variable is determined as a function of wearout mechanisms.

21. A program product according to claim 17, wherein the skew degradation variable is determined as a function of hot carrier effects.

* * * * *